Oct. 3, 1967 H. E. HENSCHEN ET AL 3,345,599

CROSS-CONNECTING BOARD

Filed Nov. 18, 1964 5 Sheets-Sheet 1

Oct. 3, 1967
H. E. HENSCHEN ET AL
3,345,599
CROSS-CONNECTING BOARD
Filed Nov. 18, 1964
5 Sheets-Sheet 2
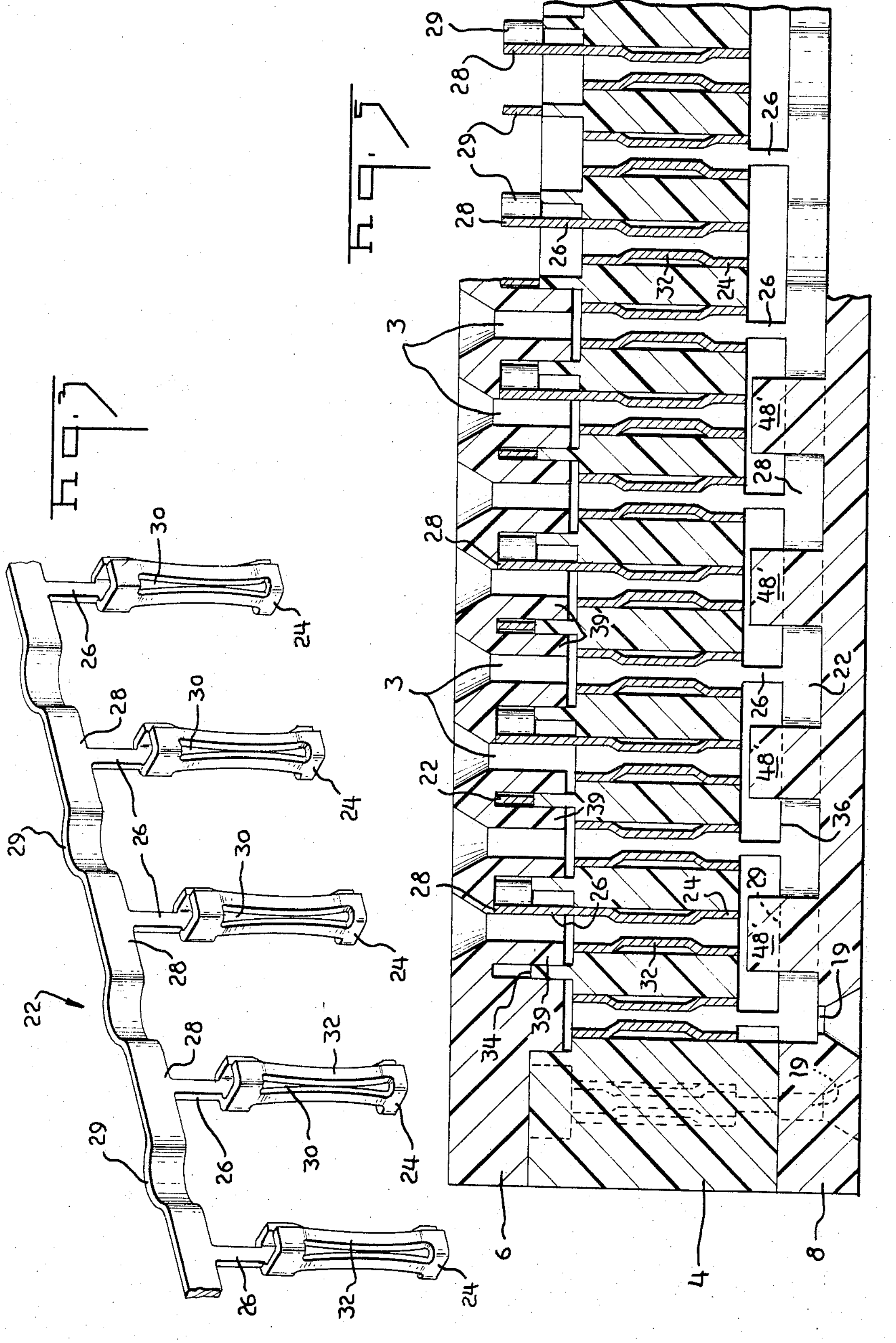

Oct. 3, 1967 H. E. HENSCHEN ET AL 3,345,599

CROSS-CONNECTING BOARD

Filed Nov. 18, 1964 5 Sheets-Sheet 5

United States Patent Office 3,345,599

Patented Oct. 3, 1967

3,345,599

CROSS-CONNECTING BOARD

Homer Ernst Henschen and Marvin Leo Yeager, Carlisle, Pa., assignors to AMP Incorporated, Harrisburg, Pa.

Filed Nov. 18, 1964, Ser. No. 412,002
6 Claims. (Cl. 339—18)

ABSTRACT OF THE DISCLOSURE

Electrical cross-connecting board has parallel X conductors and parallel Y conductors. Conductors have integral contacts located at coordinate points of grid system. Contacts integral with X conductors are located between contacts integral with Y conductors in both X and Y directions and contacts on adjacent X conductors are offset in Y direction with respect to each other. This arrangement reduces the number of contacts required without loss of cross-connecting ability.

This invention relates to electrical cross-connecting boards or pin boards for making changeable electrical connections among a plurality of conductors.

An object of the invention is to provide an improved cross-connecting board or pin board. A further object is to provide a cross-connecting board which can be made with a reduced number of contacts without sacrifice of cross-connecting possibilities. A further object is to provide a cross-connecting board in which the contact sockets and the bus bars which connect the sockets with each other are of stamped and formed construction. A still further object is to provide a cross-connecting board which can be made in a relatively small size. A further object is to provide a cross-connecting board in which all of the contact sockets lie in a single plane.

These and other objects of the invention are achieved in one embodiment comprising a board having a first plurality of parallel conductors, herein designated as X conductors, with each conductor having sockets integral therewith at periodic intervals along its length. A second plurality of conductors, herein designated as Y conductors, extend normally of the X conductors and also have contact sockets integral therewith at periodic intervals along their lengths. The X and Y conductors can therefore be considered as being arranged in acocrdance with an X-Y coordinate system. The position of the sockets on the X and Y conductors is such that even numbered X conductors $X_2$, $X_4$ have contact sockets at even numbered ordinate positions such as $Y_2$, $Y_4$. Odd numbered X conductors $X_1$, $X_3$ have contact sockets at odd numbered ordinate positions $Y_1$, $Y_3$. Even numbered Y conductors $Y_2$, $Y_4$ have contact sockets at odd numbered abscissa positions $X_1$, $X_3$ and odd numbered Y conductors $Y_1$, $Y_3$ have contact sockets at even numbered abscissa positions $X_2$, $X_4$. A first group of external leads are connected into the connetcing board on one side thereof by means of a connector having contact pins or the like which engage, for example, all of the X conductors to connect one external conductor to one X conductor in the pin board. A second group of external conductors are connected similarly to each of the Y conductors. Changeable connections are made between the external conductors by means of U-shaped jumper pins which are adapted to be inserted into any pair of adjacent sockets in the pin board thereby to connect any one of the X conductors to any one of the Y conductors and, therefore, a selected one of the external conductors on the input side to a selected external conductor of the input circuitry.

In the drawing:

FIGURE 3 is a perspective view of a section of strip having contact sockets integral therewith at periodic intervals, this type of strip being used in the pin board shown in FIGURES 1 and 2;

FIGURE 5 is a sectional view taken along the lines 5—5 of FIGURE 4A;

Figure 7:
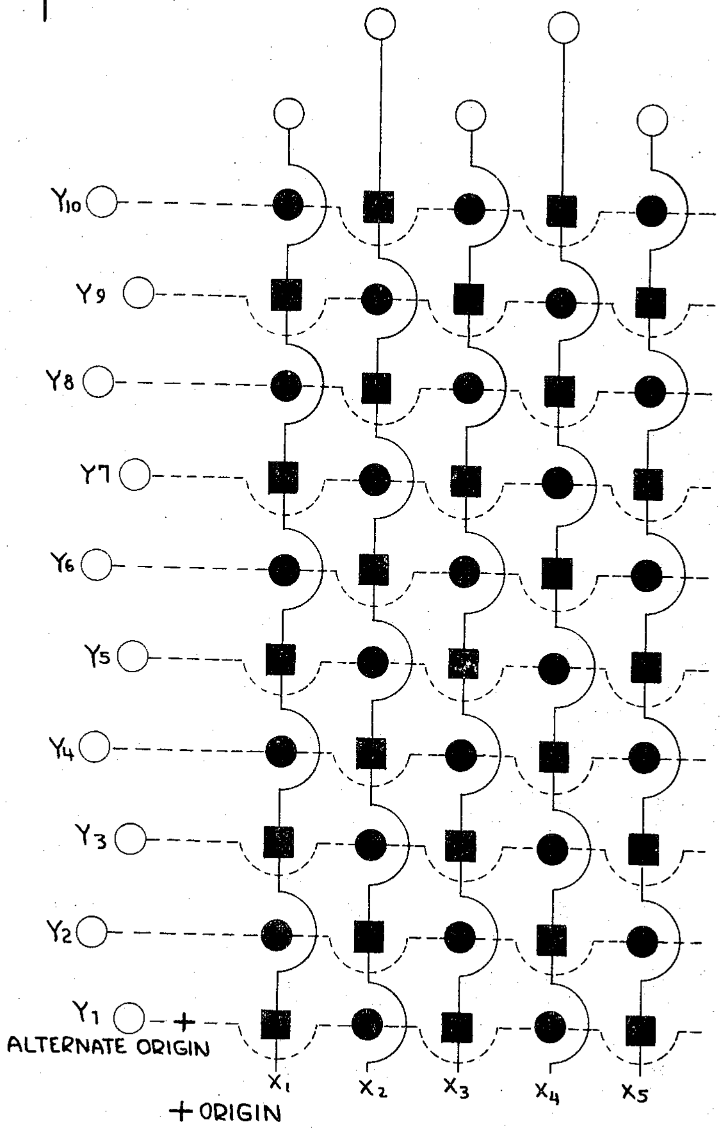
FIGURE 7 is a schematic representation of the arrangement of the contact sockets in a pin board in accordance with the invention.

In FIGURE 7, the black squares represent contact sockets which are on the X conductors, the full lines represent the X conductors, the black circles represent contact sockets which are on the Y conductors, the broken lines represent the Y conductors, the white circles represent the input and output contact sockets.

A preferred form of pin board or cross-connecting board 2 in accordance with the invention comprises a central block or body 4 having face plates 6, 8 secured to its opposite faces. The central block or body 4 contains the conductors and sockets by means of which the cross-connections are made. The plate 6 has a plurality of openings 3 extending therethrough into which U-shaped jumper members 62, 64 are inserted to make the electrical connections between the external conductors 12, 20. The external conductors 12 (e.g., input conductors) extend into a connector 10 and have contact pins 14 on their ends while a second group of external conductors 20 (e.g. output conductors) extend into a connector block 16 and have contact pins 18 on their ends. The contact pins extending from the connector 16 are inserted into a group 19 of openings along one side of the face 8 of the pin board while the pins 14 of the connector 10 are inserted into openings 15 extending along an adjacent side of the face 8. As will become apparent as this description proceeds, the conductors 12 are thereby electrically connected to a first group of bus bars within the pin board and the conductors 20 are electrically connected to a second group of bus bars within the pin board.

Figure 1:
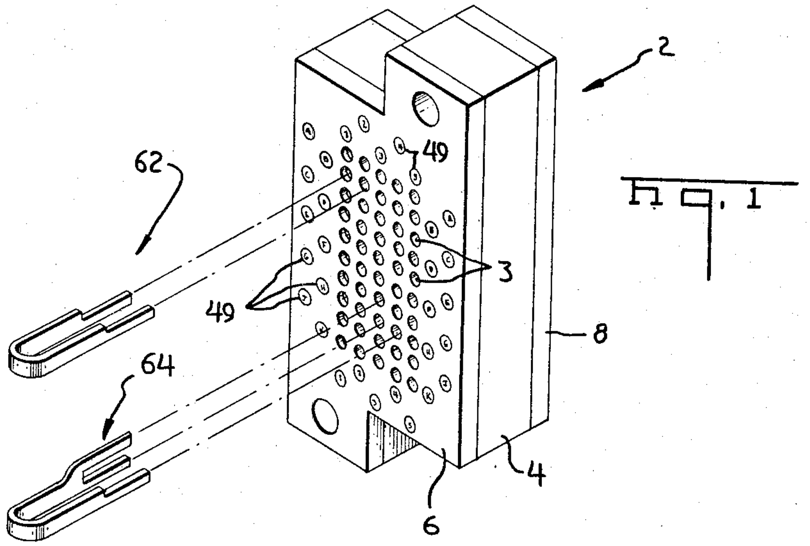
FIGURE 1 is a perspective view of one form of cross-connecting board or pin board in accordance with the invention as viewed from the side into which the jumper pins are inserted for making the changeable interconnections.
Figure 2:
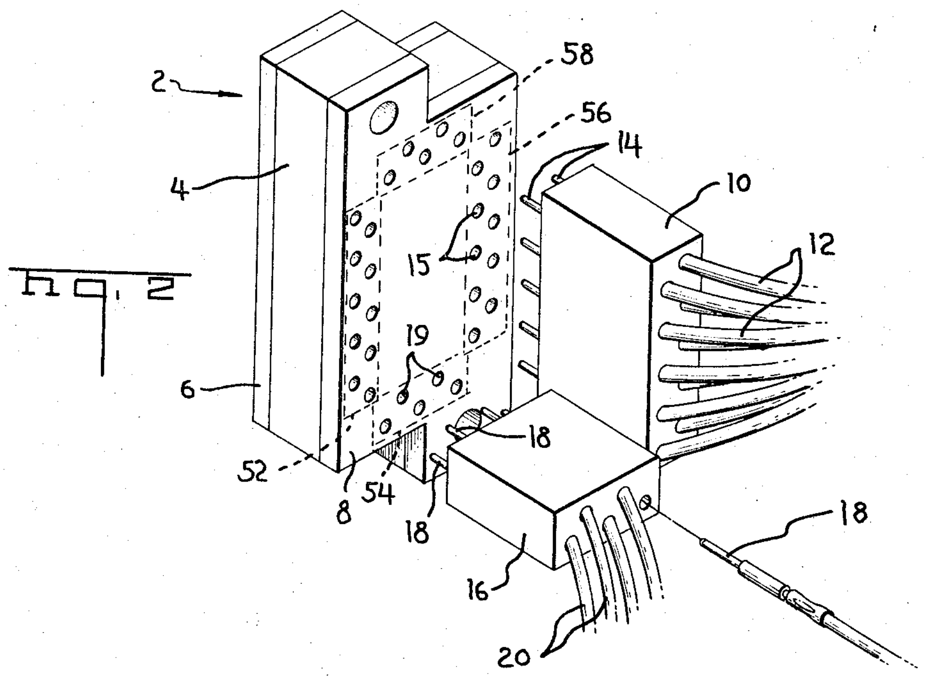
FIGURE 2 is a perspective view of the side opposite to the side shown in FIGURE 1.

Referring now to FIGURE 3, the contact sockets which are contained within the central body portion of the pin board are manufactured in the form of a strip 22 with each socket 24 being connected to an elongated carrier strip 28 by means of a neck section 26. The individual sockets 24 are of generally rectangular cross-section and have slots 30 extending along three of their corners with the sides 32 being inwardly concave so that a contact pressure will be exerted against a pin or jumper member 62, 64 as shown in FIGURE 1. The carrier strip 28 is utilized as a bus bar when a section of the strip 22 is mounted in the central body 4 of the block. Carrier strip 28 is formed with arcuate sections 29 between adjacent contact sockets for reasons which will become apparent as this description proceeds.

Figure 4A:
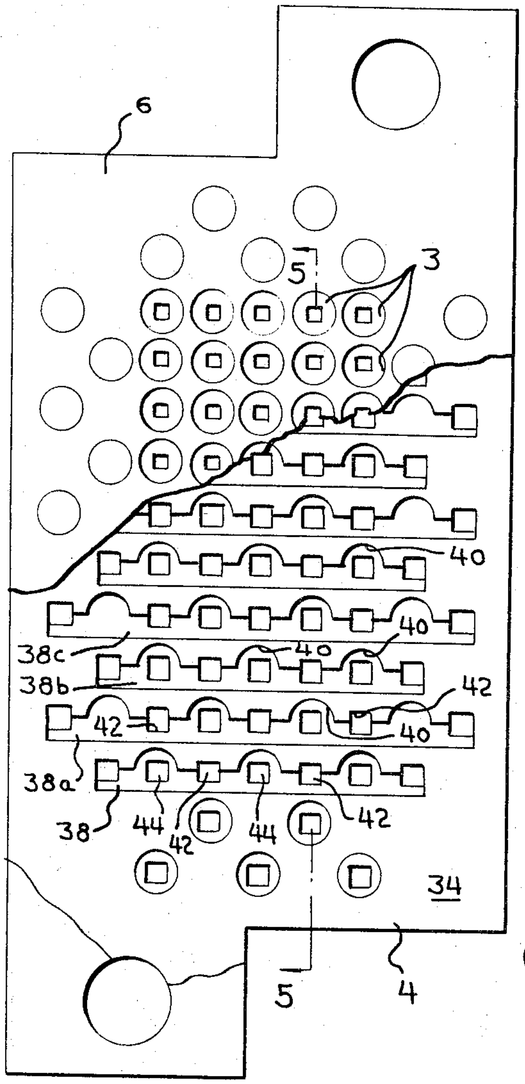
FIGURE 4A is a plan view showing one side of the pin board of FIGURE 1 with portions of the cover plate broken away.
Figure 4B:
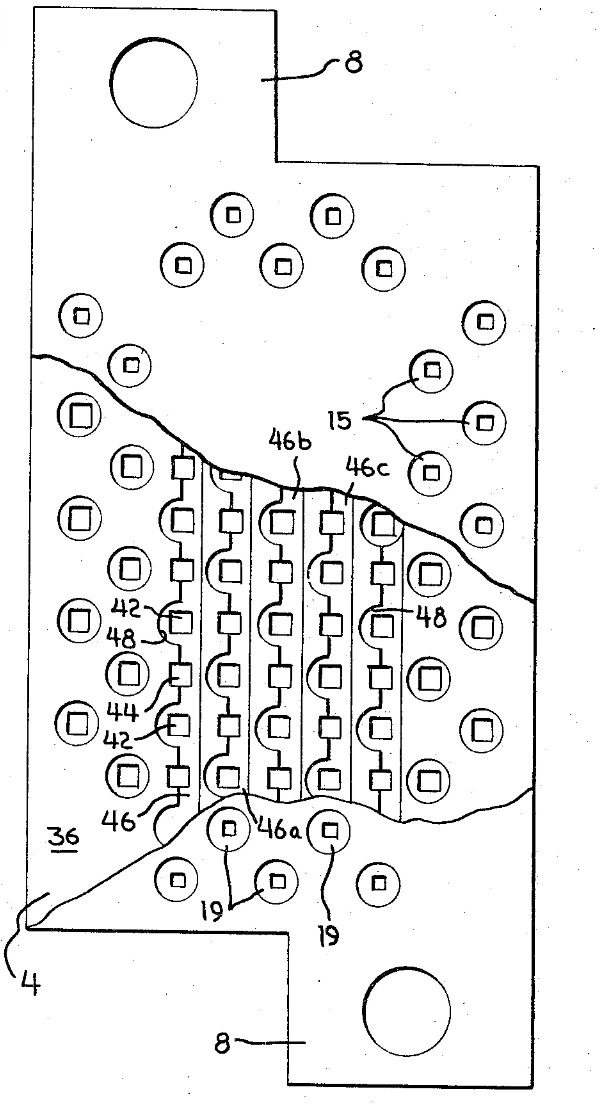
FIGURE 4B is a plan view, similar to FIGURE 4A, showing the opposite side of the pin board.
Figure 6:
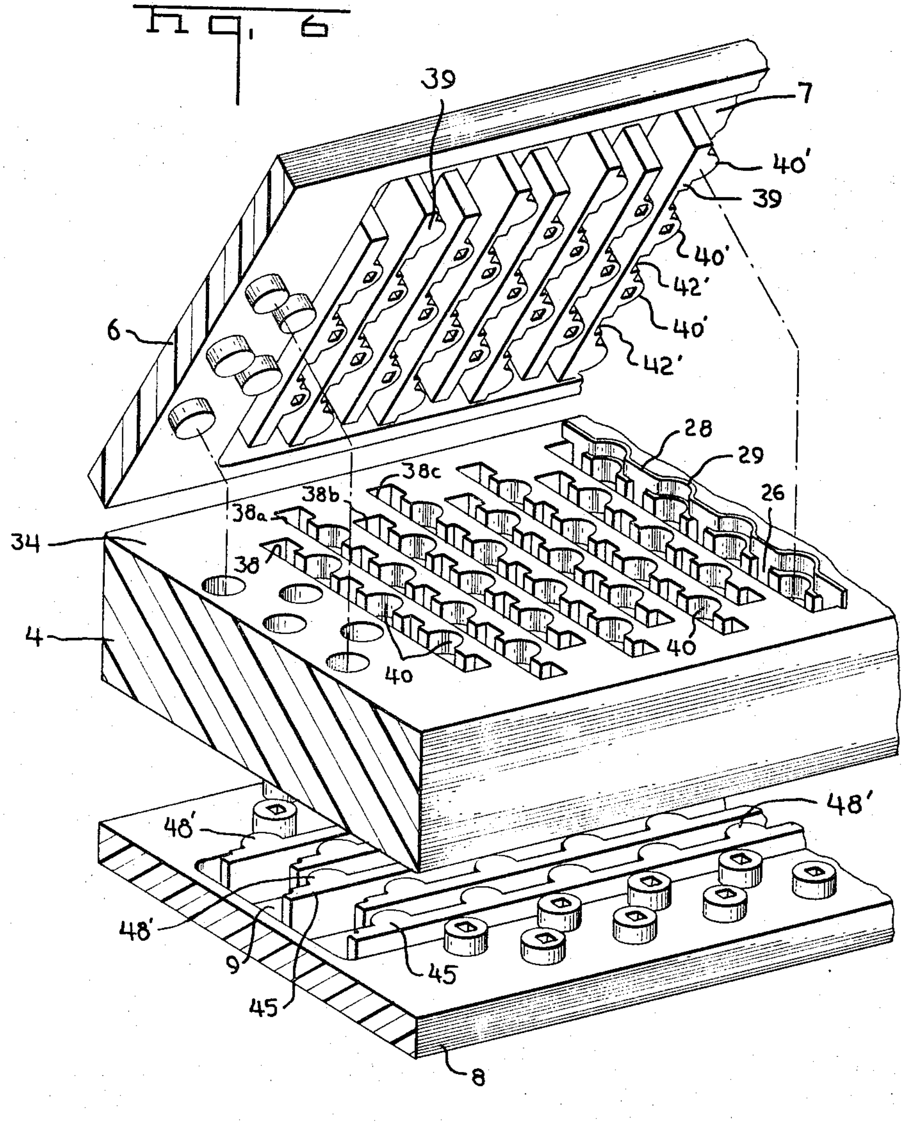
FIGURE 6 is an exploded fragmentary perspective view of a portion of the pin board of FIGURE 1.

Referring now to FIGURES 4A and 6, the central body 4 has a first side 34 in which there are provided a plurality of parallel spaced-apart grooves 38, 38_a_, 38_b_, etc., the distance between the center lines of adjacent grooves (e.g., 38_a_ and 38_b_) being substantially equal to, or slightly less than, one half of the distance between adjacent contact sockets 24 of the strip 22. It will be noted that the grooves are not all the same length but that every other groove (i.e., 38*a*, 38*c*, etc.) is somewhat longer than the grooves 38, 38*b*, etc. Spaced-apart semicylindrical recesses 40 are provided on one side of each of the grooves 38, 38*a*, etc., the centers of these recesses lying in the plane of the associated side of the groove. The centers of these recesses 40 are spaced-apart by a distance which is substantially equal to, or slightly less than, the spacing between adjacent contact sockets of the strip 22. The opposite side 36 of block 4 (see FIGURE 4B) is provided with a plurality of parallel grooves 46, 46*a*, 46*b*, etc. which are similar to the grooves 38, 38*a*, etc. on the side 35 of the block but which extend normally of the grooves on side 34. The spacing between the center lines of adjacent grooves on side 36 is equal to one half of the distance between adjacent contact sockets of the strip 22. The grooves 46 are provided with semicylindrical recesses 48, the spacing between these recesses being substantially equal to, or slightly less than, the spacing between adjacent sockets of the strip 22.

Cavities 42, 44 extend through the block 4 from the side 34 to the side 36. Each one of the cavities 44 is in alignment with one of the recesses 40 on the side 34 with the axis of each cavity 44 extending through the center of its associated recess 40. Each one of the cavities 42 is similarly in alignment with one of the recesses 48 on the side 36 of block 4. It will be apparent from FIGURES 4A and 4B that the cavities 42 open into the grooves 38, 38*a*, etc. on side 34 between adjacent recesses 40 and that the cavities 44 open into the grooves 46, 46*a*, 46*b*, etc. on side 36 between adjacent recesses 48. Since the spacing between adjacent cavities is uniform in both directions (X and Y), the cavities are arranged in accordance with a coordinate system. As will be explained more fully below, the contact sockets which extend from the X conductors of the pin board are mounted in the cavities 44 while the contact sockets which extend from the Y conductors are mounted in the cavities 42.

The face plate 6 has a rectangular recess 7 on its underside (FIGURES 5 and 6) which surrounds the group of elongated grooves 38, 38*a*, etc. of the central block 4. Bosses, generally indicated at 39, are provided in the recess 7 which conform generally to the grooves 38, 38*a*, etc. These bosses each comprise an elongated rib having spaced-apart arcuate projections 40′ on one side with rectangular open-sided cavities 42′ being provided between adjacent pairs of arcuate projections 40′. The bosses 39 extend beyond the surface of the underside 5 of the plate 6 so that when the plate is disposed against the surface 34, the bosses will extend into the spaced-apart grooves 38, 38*a*, etc.

The plate 8 is similarly provided with a generally rectangular recess 9 having parallel spaced-apart bosses 45 therein which conform to the spaced-apart grooves 46 of the side 36 of the central block 4. These bosses 45 thus have spaced-apart arcuate projections 48′ corresponding to the recesses 48 on the side 36 of the central block. It will be noted that the plate 8 is not provided with openings corresponding to the openings 3 of the plate 6 since the jumpers 62, 64 are not inserted from the back of the pin board but only through the face plate 6.

When the pin board is assembled, a short section of the strip 22 is mounted adjacent to each of the grooves 38, 38*a* of the side 34 of block 4 with the integral sockets 24 extending into the cavities 42, as best shown in FIGURE 6, and with the arcuate section 29 of the carrier strip 28 extending parallel to the walls of the recesses 40. Only one section of strip is shown in FIGURE 6 in the interest of clarity. After sections of strip have thus been mounted alongside each of the grooves 38, 38*a*, 38*b*, etc., the face plate 6 is secured against the surface 34 of the block 4 and these strips of contact sockets will then be retained in position by the projecting portions of the bosses 39. In a similar manner, sections of strip 22 are positioned on the side 36 of the block 4 beside the grooves 46, 46*a*, etc. with the contact sockets extending into the cavities 44 and with the arcuate portions of the strip extending parallel to the semicylindrical recesses 48. After these strips have been positioned on the side 36, the plate 8 is secured against the side 36 and the bosses will retain the carrier strips in their proper positions. FIGURE 5 shows the manner in which the separate strips 22 are contained in the completed pin board and retained in position by the plates 6, 8.

In the finished and assembled pin board, the individual sections of strip 22 which are mounted against the side 34 of the central block 4, constitute a plurality of Y conductors which can be designated as $Y_1$, $Y_2$, etc., in accordance with their distance from the origin of the system which can be selected in the lower left-hand corner of the grid system as viewed in FIGURE 7. The sections of strip mounted against the side 36 of the block 4 similarly constitute X conductors which can be designated at $X_1$, $X_2$, etc.

As previously noted, the plate 6 is provided with openings 3 arranged in accordance with the coordinate grid system of the block and in alignment with the cavities 42, 44 extending through the block 4. Suitable indicia 49 may be provided on the plate 6 to locate the individual X and Y conductors when circuit connections are being made. The cavities which lie within the marginal zones indicated at 52, 54, 56, 58 are not utilized for making cross-connections but are rather utilized as input and output sockets which receive the contact pins extending from the connectors 10, 16. The plate 8 is thus provided with openings 15, 19 only along its edges and in alignment with the cavities lying within the marginal zones 52, 54, 56, 58.

FIGURE 7 shows the positions of X and Y conductors and the sockets integral with the X and Y conductors for the block illustrated in FIGURES 1–7. In FIGURE 7, the several X conductors are designated as $X_1$, $X_2$, etc. while the Y conductors are designated as $Y_1$, $Y_2$, etc., these designations being selected in accordance with the assumption that the origin is in the lower left-hand corner of FIGURE 7.

If the origin is selected at the position indicated in FIGURE 7, it will be apparent that even numbered X conductors $X_2$, $X_4$ have contact sockets at even numbered ordinate positions $Y_2$, $Y_4$. Odd numbered X conductors $X_1$, $X_3$ have contact sockets at odd numbered ordinate positions $Y_1$, $Y_3$. Even numbered Y conductors $Y_2$, $Y_4$ have contact sockets at odd numbered abscissa positions $X_1$, $X_3$ and odd numbered Y conductors $Y_1$, $Y_3$ have contact sockets at even numbered abscissa positions $X_2$, $X_4$.

It should be mentioned that the origin can be selected so that an alternative convention will result as regards the locations of the contact sockets in the grid system. In other words, if the origin of the coordinate grid system is assumed to be at A′, then even numbered X conductors $X_2$, $X_4$ will have contact sockets at odd numbered ordinate positions $Y_1$, $Y_3$. The locations of the other contact sockets in accordance with this alternative convention will be readily apparent from an inspection of FIGURE 7.

The invention can thus be defined with either of the above two conventions depending upon the selection of the location of the origin of the grid system. In the interest of simplicity, the origin is assumed to be at A in FIGURE 7 in this specification and in the appended claims.

It will be seen from FIGURE 7 that by the use of a U-shaped contact jumper of the type shown at 62, any one of the X conductors can be electrically connected to any one of the Y conductors. Additionally, any two adjacent X conductors can be connected to any one of the Y conductors, or any two adjacent Y conductors can be connected to any X conductor by the use of a contact jumper of the type shown at 64 having three contact pins. A cross-connecting board in accordance with the invention thus provides all of the possibilities of interconnection among the groups of external conductors 12, 20.

While the embodiment of the invention disclosed herein has the contact sockets arranged in accordance with a square grid coordinate system, the principles of the invention are not limited to a grid system of this specific type and it may be desired, under some circumstances, to employ a different grid system. For example, the sockets might be arranged on a parallelogram grid system in which the rows of X sockets extend obliquely of the rows of Y contacts. Under some circumstances, there are advantages to be gained with a parallelogram type grid system; for example, if the rows of X sockets intersect the rows of Y sockets at angles of 60 degrees, the centers of the sockets will be arranged in accordance with an equilateral triangle pattern. With a grid pattern of this type, it would be possible to connect two adjacent X conductors of the panelboard with the same type of two-pronged jumper pin 62 as would be used to connect an X conductor with a Y conductor.

A significant advantage of the invention is that for a given number of external conductors in the connectors 10, 16, all of the possible combinations of interconnections can be achieved with a minimum number of contacts in the board itself. The actual number of contact sockets required is equal to $(X \times Y)+X+Y$. A further advantage is that a relatively simple construction is achieved by virtue of the fact that the contacts and bus bars are of stamped and formed construction.

While pin boards in accordance with the invention may be made in any desired size, it should be mentioned that the principles of the invention are particularly useful in the construction of relatively small pin boards. For example, a pin board of the type shown in the drawing has been made using strip 22 of a size such that the adjacent contacts were spaced-apart by a distance of 0.150″. When this size strip is used, a board having five X conductors and ten Y conductors has overall dimensions of 1.334″ by 0.75″.

A pin board in accordance with the invention can be used in conjunction with pluggable circuit components, such as diodes, resistors, etc. of conventional type. For example, if it is desired to connect a given input conductor to a diode and the diode to a given output conductor, it is merely necessary to plug one of the leads from the diode into one of the sockets of the bus bar 28 to which the input conductor is connected and to plug the other lead of the diode into a socket which is integral with the bus bar which in turn is electrically connected to the desired output conductor.

Changes in construction will occur to those skilled in the art and various apparently different modifications and embodiments may be made without departing from the scope of the invention. The matter set forth in the foregoing description and accompanying drawings is offered by way of illustration only.

We claim:

1. Means for making electrical connections among a plurality of conductors comprising a plurality of X conductors and a plurality of Y conductors, said X and Y conductors, and extending transversely of each other in accordance with an X-Y grid system, said conductors being electrically separated from each other, said X conductors being designated as $X_1$, $X_2$, etc., in accordance with their intersections with the X axis of said grid system and said Y conductors being designated as $Y_1$, $Y_2$, etc., in accordance with their intersection with the Y axis of said grid system, even numbered X conductors ($X_2$, $X_4$), having contacts at only even numbered ordinate positions ($Y_2$, $Y_4$), and odd numbered X conductors ($X_1$, $X_3$) having contacts at only odd numbered ordinate positions ($Y_1$, $Y_3$), even numbered Y conductors ($Y_2$, $Y_4$) having contacts at only odd numbered abscissa positions ($X_1$, $X_3$), and odd numbered Y conductors ($Y_1$, $Y_3$) having contacts at only even numbered abscissa positions ($X_2$, $X_4$) said contacts conforming to, and being engageable with contact terminal portions of jumper members whereby, any point on said grid system can be electrically connected to any other point.

2. A device as set forth in claim 1 wherein said contacts comprise sockets connected to said conductors, said sockets being disposed in a common plane with said X conductors being on one side of said plane and said Y conductors being on the other side of said plane.

3. A device as set forth in claim 1 wherein said X conductors and said Y conductors each have input contacts at the ends thereof.

4. An electrical pin board for making changeable interconnections between conductors, said board having a plurality of X conductors and a plurality of Y conductors therein, said X and Y conductors extending transversely of each other in accordance with an X-Y coordinate system, and X conductors extending parallel and adjacent to one face of said board and said Y conductors extending parallel and adjacent to the opposite face of said board, said X conductors being designated as $X_1$, $X_2$, etc., in accordance with their intersections with the X axis of said grid system and said Y conductors being designated at $Y_1$, $Y_2$, etc., in accordance with their intersections with the Y axis of said grid system, even numbered X conductors ($X_2$, $X_4$) having contact sockets at only even numbered ordinate positions ($Y_2$, $Y_4$), and odd numbered X conductors ($X_1$, $X_3$) having contact sockets at only odd numbered ordinate positions ($Y_1$, $Y_3$), even numbered Y conductors ($Y_2$, $Y_4$) having contact sockets at only odd numbered abscissa positions ($X_1$, $X_3$) and odd numbered Y conductors ($Y_1$, $Y_3$) having contact sockets at only even numbered abscissa positions ($X_2$, $X_4$), the axes of said contact sockets extending normally of the plane of said board, a plurality of openings on one side of said board in alignment with said sockets, said openings permitting insertion of jumper members to make interconnections bewteen X and Y conductors, and a row of openings extending in the X direction and a row of openings extending in the Y direction on the opposite side of said board, said row of openings permitting insertion of input and output contacts into X and Y conductors of said board.

5. An electrical pin board for making changeable interconnections between conductors comprising, an insulating block, cavities extending through said block from one face thereof to the other face, said cavities being arranged in accordance with a square grid X-Y coordinate system, a first series of spaced-apart bus bars on one side of said block, said bus bars extending parallel to each other and parallel to the X axis of said grid system, said first series of bus bars having contacts integral therewith extending into every other one of said cavities, in the X direction and in the Y direction a second series of spaced-apart bus bars on the opposite side of said block said second series of bus bars extending parallel to each other and parallel to the Y axis of said grid system, said second series of bus bars having contacts integral therewith extending into the remaining ones of said cavities, means for connecting a first group of external conductors to individual bus bars of said first series of said bus bars, and means for connecting a second group of external conductors to individual bus bars of said second series of bus bars whereby, any one of said first group of external conductors can be electrically connected to any one of said second series of external conductors upon insertion of a jumper member into two of said cavities.

6. Means for making electrical connections among a plurality of conductors comprising a first series of parallel speced-apart bus bars in one plane, a second series of parallel spaced-apart bus bars in a second plane, said second plane extending parallel to, and being spaced from said first plane, said second series of bus bars extending transversely of said first series of bus bars, each of said bus bars having a plurality of contact sockets thereon at equally spaced intervals, said sockets being disposed between said planes with their axes extending normally of said planes, said sockets being arranged on an X-Y coordinate system with the sockets of the first series of bus bars being disposed between the sockets of the second series of bus bars, in the X direction and in the Y direction, means for connecting a first group of external conductors to said first series of bus bars, and means for connecting a second group of external conductors to said second group of bus bars whereby, any one of said external conductors can be electrically connected to any other one of said external conductors by means of a jumper member having its ends inserted into two of said sockets.

References Cited

UNITED STATES PATENTS

| | | | |
|---|---|---|---|
| 1,946,889 | 2/1934 | Wessell | 339—18 |
| 2,922,135 | 1/1960 | Hoberg et al. | 339—18 |
| 3,027,534 | 3/1962 | Deakin | 339—18 |
| 3,249,905 | 5/1966 | Ruehlemann | 339—18 |
| 3,267,407 | 8/1966 | Humphries et al. | 399—18 |

MARVIN A. CHAMPION, *Primary Examiner.*

PATRICK A. CLIFFORD, *Examiner.*

UNITED STATES PATENT OFFICE

CERTIFICATE OF CORRECTION

Patent No. 3,345,599 October 3, 1967

Homer Ernst Henschen et al.

It is hereby certified that error appears in the above numbered patent requiring correction and that the said Letters Patent should read as corrected below.

Column 5, line 62, strike out ", and"; column 6, line 20, for "and", first occurrence, read -- said --; line 26, for "at" read -- as --.

Signed and sealed this 12th day of November 1968.

(SEAL)

Attest:

Edward M. Fletcher, Jr.

Attesting Officer

EDWARD J. BRENNER

Commissioner of Patents